United States Patent
Kimura

(10) Patent No.: US 7,235,133 B2
(45) Date of Patent: Jun. 26, 2007

(54) METHOD FOR GROWING SINGLE CRYSTAL OF SEMICONDUCTOR

(75) Inventor: Masanori Kimura, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 52 days.

(21) Appl. No.: 10/030,867

(22) PCT Filed: Feb. 16, 2001

(86) PCT No.: PCT/JP01/01125

§ 371 (c)(1),
(2), (4) Date: Apr. 29, 2002

(87) PCT Pub. No.: WO01/63023

PCT Pub. Date: Aug. 30, 2001

(65) Prior Publication Data

US 2002/0166499 A1 Nov. 14, 2002

(30) Foreign Application Priority Data

Feb. 22, 2000 (JP) .............................. 2000-044422

(51) Int. Cl.
C30B 15/00 (2006.01)
C30B 21/06 (2006.01)
(52) U.S. Cl. .......................... 117/213; 117/30; 117/32; 117/917; 117/200; 117/13; 117/14; 117/15
(58) Field of Classification Search ............ 117/13–15, 117/33, 30, 11, 213, 200, 917, 32
See application file for complete search history.

(56) References Cited

U.S. PATENT DOCUMENTS 4,981,549 A * 1/1991 Yamashita et al. ....... 156/620.4
5,264,189 A * 11/1993 Yamashita et al. .......... 422/249
5,885,344 A * 3/1999 Kim et al. .................... 117/13
6,156,119 A * 12/2000 Hoshi et al. .................. 117/30
6,458,202 B1 * 10/2002 Kojima et al. ................ 117/13
6,562,125 B2 * 5/2003 Schupp et al. ................ 117/73
6,602,345 B1 * 8/2003 Schupp et al. .............. 117/200

FOREIGN PATENT DOCUMENTS

| JP | 2-221184 | 9/1990 |
|---|---|---|
| JP | 7-133187 | 5/1995 |
| JP | 8-143392 | 6/1996 |
| JP | 9-175889 | 7/1997 |

OTHER PUBLICATIONS

Sears et al., University Physics, 7th Ed., Addison-Wesley Pub Co., pp. 363-365, 1987.*

* cited by examiner

*Primary Examiner*—Yogendra Gupta
*Assistant Examiner*—G. Nagesh Rao
(74) *Attorney, Agent, or Firm*—Hogan & Hartson LLP

(57) ABSTRACT

By utilizing a crystal pulling apparatus for producing a single crystal according to the Czochralski method comprising at least a crucible to be charged with a raw material, a heater surrounding the crucible, and subsidiary heating means provided below the crucible, a single crystal is pulled or the raw material is additionally introduced with heating by the heater surrounding the crucible and the subsidiary heating means when the amount of the raw material melt in the crucible becomes a limited amount. Thus, there is provided a method for growing a single crystal at a high yield while preventing solidification of melt raw material decreased to a limited amount without affecting crystal quality, durability of crucible or the like even when a crucible having a large diameter is used.

4 Claims, 4 Drawing Sheets

METHOD FOR GROWING SINGLE CRYSTAL OF SEMICONDUCTOR

TECHNICAL FIELD

The present invention relates to a method for growing a semiconductor single crystal composed of, for example, silicon, by the Czochralski method (also referred to as "CZ method" hereinafter).

BACKGROUND ART

Currently, semiconductor single crystals such as those composed of silicon are produced by the CZ method in many cases. As shown in FIG. 3, an apparatus for producing a semiconductor single crystal used for this CZ method comprises a crucible 4 in which a raw material 12 is charged, a heater 2 surrounding the crucible 4, a heat insulating material 8 disposed around the heater, pulling means for bringing a seed crystal 14 into contact with a melt in the crucible and growing a single crystal, and a metal chamber 17 for accommodating the aforementioned members.

In a conventional growing process of a semiconductor single crystal by the CZ method, a single crystal 13 is grown by using the aforementioned apparatus for producing a semiconductor single crystal, in which process the raw material 12 is charged in the crucible 4 and heated by the heater 2 surrounding the crucible 4 to form a melt, and the seed crystal 14 is brought into contact with the melt and slowly pulled with rotation to grow the single crystal 13. The single crystal 13 is pulled so that it should have a portion having an increasing diameter 13a, a portion having a constant diameter (also referred to as "straight body") 13b, which can be used as a product, and a portion having a decreasing diameter 13c, and it is detached from the melt after the portion having a decreasing diameter 13c is formed.

In order to obtain a high yield in the production of a single crystal, it is necessary to form the portion having a constant diameter as long as possible in contrast to the lengths of the portion having an increasing diameter and the portion having a decreasing diameter, and it is necessary that the pulling is performed from the melt in an amount as large as possible. If the diameter of the crystal becomes larger, the proportions of the portion having an increasing diameter and the portion having a decreasing diameter become larger. Therefore, the aforementioned necessity becomes more important, and it becomes more necessary to use a larger amount of the raw material by using a crucible having a larger diameter.

Further, as another factor for obtaining a high yield, it is also important to pull a single crystal ingot until the remaining amount of the melt reaches the possible smallest amount. In this specification, a value representing a ratio of weight of a grown single crystal relative to weight of initial raw material before the crystal is pulled, which is expressed in terms of percentage, is called a single crystal formation ratio. If this term is used, it can be said that, in order to pull a crystal having a large diameter with a high yield, it is important to use a crucible having a large diameter and, at the same time, pull a single crystal ingot at a high single crystal formation ratio.

However, since the radiant heat quantity from the melt surface increases with use of a crucible having a larger diameter, heating from the lateral direction only by the heater surrounding the crucible tends to become insufficient in terms of heating quantity. In particular, in the period of pulling of the latter half of the straight body of single crystal ingot or after the single crystal ingot is detached, the heat receiving area from the lateral direction is decreased, because the melt becomes shallow, and therefore the heating efficiency is decreased. As a result, a phenomenon of solidification of the melt frequently occurs. The term "solidification" used herein means a phenomenon that the surface or a part of internal portion of the melt or the whole melt is cooled and becomes solid. The worst result due to the solidification phenomenon is caused when a solid portion formed in the melt in contacted with the growing interface of the crystal. In such a case, because the crystal grows with dislocations thereafter, the pulling of the single crystal becomes, impossible. Further, when most of the melt is solidified, a stress is applied to a crucible due to the volume change of the melt (volume expansion in the case of silicon) and cracks may be generated in the crucible. Therefore, it may be necessary to stop the pulling of the crystal thereafter.

In order to avoid such solidification of the melt, it is contemplated to increase the electric power supplied to the heater surrounding the crucible as shown in FIG. 4. However, if the heating quantity supplied from the heater is increased, the temperature gradient of the single crystal under pulling becomes small, and thus the growing rate of the single crystal must be lowered. Alternatively or moreover, the crystal is gradually cooled in the temperature region in which crystal defects are formed, and thus there is caused a problem that defective size becomes larger. The crystal defects formed in this case are cavities called voids or aggregations (clusters) of dislocations, which are formed as a result that vacancies or interstitial atoms incorporated at the growing interface of the crystal aggregate during the subsequent cooling.

Further, if the electric power supplied to the heater is unduly increased, the temperature of the crucible is excessively elevated. As a result, the crucible may be deformed, or the internal surface of the crucible contacting with the melt may be degenerated. If the crucible is significantly deformed, the crucible touches the single crystal and the members including the heater, and it becomes unavoidable to interrupt the pulling. Further, when the crucible surface that is in contact with the melt is degenerated, the degenerated portions may fall off into the melt and reach the glowing interface of the crystal, so that dislocations may be generated in the single crystal.

While the problems to be caused during the pulling of crystal when the amount of the melt remained in the crucible becomes small have been explained above, the problems concerning the solidification and degradation of crucible due to excessive heating by heater are similarly observed with respect to the melt remained in the crucible after a single crystal is detached. That is, the solidification of the melt remained in the crucible poses a problem when multi-pulling is performed. The term "multi-pulling" used herein means that, after a grown single crystal ingot is detached from a melt and taken out from an apparatus for producing a single crystal, a raw material is additionally introduced into the melt remained in a crucible and melted and then a seed crystal is brought into contact with the melt to pull another single crystal ingot again.

In the multi-pulling, it is necessary to prevent the melt from rapidly solidifying during the period after a single crystal is detached and before finishing the additional charge of the raw material and melting of the whole raw material in the crucible. In particular, when a raw material is newly added to a small amount of the melt, heat of the melt is taken by the introduced raw material and the temperature of the melt may be rapidly decreased. At that time, if the melt is rapidly solidified and thus an abnormal stress is applied to the crucible due to the volume change of the raw material, cracks may be generated in the crucible.

As explained above, conventional techniques could not prevent the solidification of melt in a crucible without effecting crystal quality and operability when a crystal is pulled at a high single crystal formation ratio by using a crucible having a large diameter, or when a raw material is additionally introduced into a limited amount of melt in the multi-pulling, and therefore suitable means for solving the problems have been desired.

DISCLOSURE OF THE INVENTION

The present invention was accomplished in view of the aforementioned problems, and its object is to provide a method for preventing solidification of melt raw material decreased to a limited amount without affecting crystal quality, durability of crucible or the like.

The inventor of the present invention assiduously studied about a method for growing a crystal that enables continuous crystal pulling in crystal pulling using a crucible having a large diameter without inviting solidification of melt even when the amount of the melt is decreased to a limited amount. As a result, they conceived to solve the aforementioned problems by using subsidiary heating of the crucible from below, which shows constant heat conduction efficiency even though the amount of the melt is decreased, and made various improvements. Thus, they finally accomplished the present invention.

In order to achieve the aforementioned object, the method for growing a semiconductor single crystal of the present invention is a method for growing a semiconductor single crystal according to the Czochralski method utilizing an apparatus for producing a semiconductor single crystal having a crucible to be charged with a raw material, a heater surrounding the crucible, pulling means for bringing a seed crystal into contact with a melt contained in the crucible and growing a single crystal and a metal chamber for accommodating the foregoing members, wherein the apparatus is provided with subsidiary heating means below the crucible and the single crystal is pulled with subsidiarily heating the crucible by the subsidiary heating means in addition to the heating by the heater surrounding the crucible for a period after a ratio of a weight of the growing crystal during the pulling of the crystal relative to a weight of raw material melt before the growing becomes 60% or more.

As described above, if the crucible is subsidiarily heated from below for a period after a ratio of a weight of the growing crystal relative to a weight of initial raw material melt before the growing becomes 60% or more, where solidification of the remaining melt becomes likely to occur, it becomes possible to efficiently supplement heat to the crucible from below for a wide area, even if heat is taken away from the melt surface by radiation. In addition, the heat receiving area does not substantially change depending on the amount of the melt, unlike the radiant heat from the heater surrounding the crucible, and therefore the method has characteristic that constant heating efficiency is always obtained irrespective of the amount of the melt. Further, the heating of the bottom surface of the crucible accelerates heat transfer by natural convection and hence the whole melt is efficiently heated. Therefore, there can be obtained better temporal response of the melt temperature with respect to the electric power supplied to the subsidiary heater compared with the lateral heating. This means that it can cope with a case where a crystal is pulled at a particularly high rate and hence decreasing rate of the melt amount is high.

Further it becomes unnecessary to unduly increase the electric power supplied to the heater surrounding the crucible, and variation of temperature distribution of the single crystal and deformation or degeneration of the crucible are prevented. As a result of the above, it becomes possible to pull a crystal up to a high single crystal formation ratio even by using a crucible having a large diameter.

In the method of the present invention, the heating by the aforementioned subsidiary heating means is preferably performed so that temperature gradient of the single crystal surface along the pulling axis direction should be constant irrespective of the weight ratio of the growing crystal relative to the weight of raw material melt before the growing, and further, electric power values of the heater surrounding the crucible and the subsidiary heating means and/or a ratio of the both power values are preferably obtained by calculation based on global heat transfer analysis, the obtained value(s) is/are used as a target value or values of control, and electric powers supplied to the heater surrounding the crucible and the subsidiary heating means are preferably controlled to be as near the target value or values as possible during the pulling of the single crystal.

If the control is performed so that the single crystal ingot should have constant thermal history for the pulling direction as described above, size and distribution of crystal defects can be kept constant with respect to the pulling direction irrespective of the decrease of the amount of the melt, and therefore a crystal having a constant quality can be obtained with a high yield. Furthermore, if the electric powers supplied to the heaters are controlled according to a value or values determined by calculation based on global heat transfer analysis, it becomes unnecessary to determine a combination of electric powers supplied to the heaters by trial and error basis in order to obtain constant crystal quality along the pulling direction. Therefore, production techniques can be developed with low cost. The term "calculation based on global heat transfer analysis" used herein means numerical simulation wherein heat transfer by radiation and conduction between structural members of the apparatus for producing a single crystal is calculated and thereby temperature distribution in the apparatus is obtained.

The method for growing a semiconductor single crystal of the present invention is also a method for growing a semiconductor single crystal in which multi-pulling is performed according to the Czochralski method utilizing an apparatus for producing a semiconductor single crystal having a crucible to be charged with a raw material, a heater surrounding the crucible, pulling means for bringing a seed crystal into contact with a melt contained in the crucible and growing a single crystal and a metal chamber for accommodating the foregoing members, wherein the apparatus is provided with subsidiary heating means below the crucible, and after a grown single crystal is detached from the melt and taken out from the apparatus for producing a crystal, a raw material is newly added to the raw material remained in the crucible and melted, and when a seed crystal is brought into contact with the melt to pull a single crystal again, the crucible is heated by the heater surrounding the crucible and the subsidiary heating means so that the raw material melt should not be solidified at least for a period from the point of the detachment of the single crystal ingot to the point of complete melting of the raw material in the crucible including the raw material newly added thereto.

If the melt in the crucible is heated from below as described above, occurrence of solidification can be prevented even for a small amount of melt remained in the crucible. It is considered that this effect can be obtained by the fact that a wide and constant area for receiving heat from the subsidiary heater can be secured irrespective of the amount of the melt in the heating for the bottom surface of the crucible as described above, and heat transfer in the melt is accelerated by natural convection caused by the heating of the bottom surface. As a result, the raw material can be introduced at a high introduction rate.

Further, it becomes unnecessary to markedly increase the electric power supplied to the heater surrounding the crucible, and hence deformation and decrease of durability of the crucible due to excessive heating can be preliminarily prevented.

Furthermore, since the amount of the melt to be remained in the crucible can be reduced compared with a conventional method, a single crystal can be obtained with a high yield.

It is a case where, for example, a single crystal having a diameter of 12 inches (300 mm) or more is grown by using a crucible having an inner diameter of 28 inch (about 711 mm) or more that the method for growing a semiconductor single crystal of the present invention is particularly effective. In the case of silicon single crystals, an increasingly larger diameter has been used, and it is expected that a single crystal having a diameter of 16 inches (400 mm) or 20 inches (500 mm) or more will be required. Corresponding to it, the inner diameter of the crucible also becomes larger, and the crystal growth will be performed in a crucible having an inner diameter of 40 inches (about 1000 mm) or 60 inches (about 1500 mm) or more. It can be said that, in such a case, the need for the present invention becomes still higher.

As explained above, even when a crucible having a large diameter is used, the present invention enables stable growth of a single crystal without generating solidification of melt until the amount of the raw material melt remained in the crucible becomes small. Further, the melt can be stably maintained at the time of additional introduction of the raw material in the multi-pulling. As a result, it becomes possible to obtain a single crystal with a high yield. Furthermore, it also becomes possible to pull a single crystal having crystal quality stabilized along the growing direction.

BEST MODE FOR CARRYING OUT THE INVENTION

Hereafter, embodiments of the present invention will be explained. However, the present invention is not limited to these.

Figure 1:
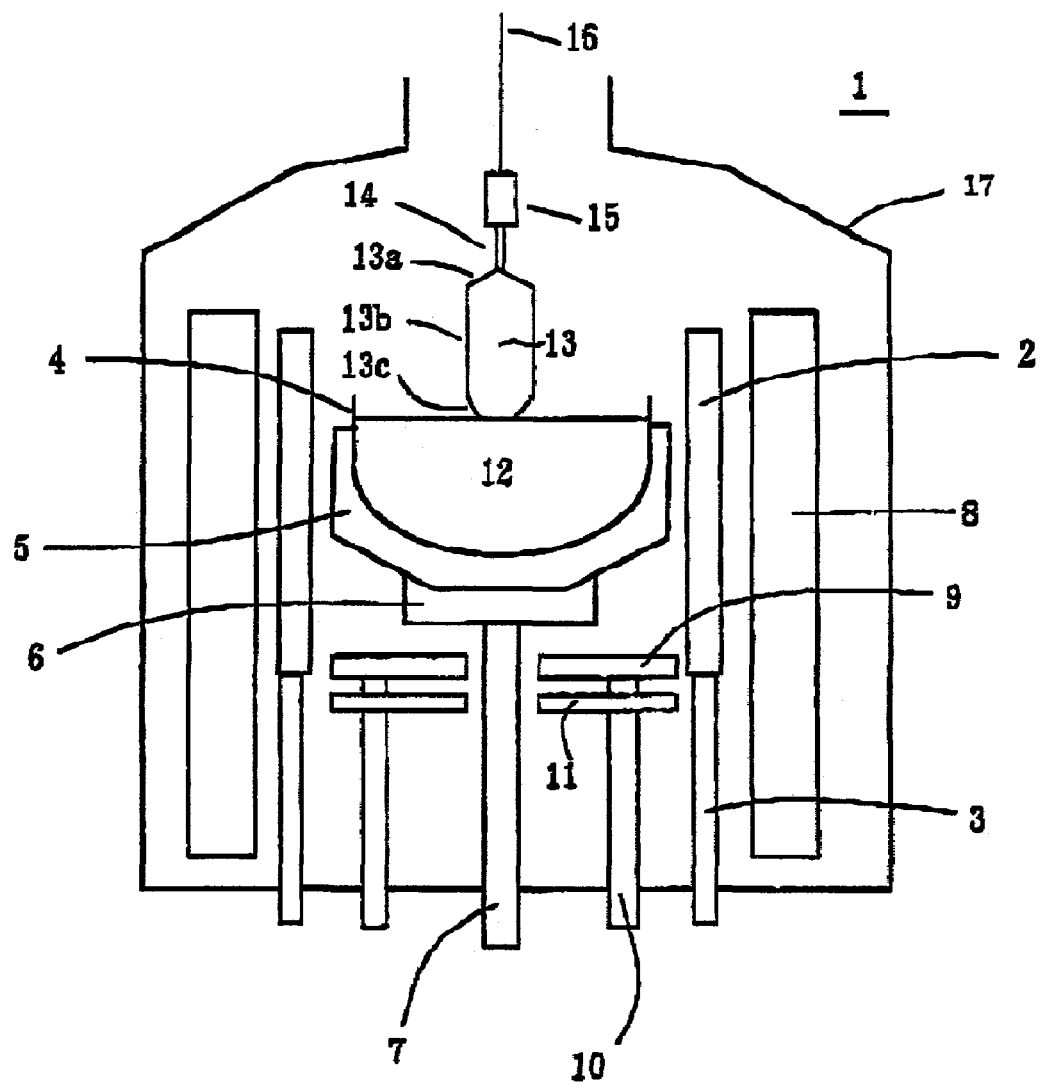
FIG. 1 is an explanatory view showing an exemplary apparatus for pulling a crystal used for the present invention.

FIG. 1 is an explanatory view showing an exemplary apparatus for pulling a single crystal used for the present invention. As shown in FIG. 1, the apparatus for pulling a crystal for producing a crystal by the Czochralski method (semiconductor single crystal production apparatus) 1 comprises a quartz crucible 4 to be charged with a raw material 12 and a graphite crucible 5 that supports the crucible 4, and further comprises a heater 2 surrounding the crucibles. Outside the heater 2, a heat insulating material 8 is disposed so as to obtain insulation effectiveness. These members are each accommodated in a metal chamber 17.

As for the pulling of a single crystal 13, a seed crystal 14 is held by a seed holder 15 connected to a wire 16 of which end is connected to a crystal pulling mechanism (not shown), and the seed crystal 14 is brought into contact with a melt 12 and slowly pulled with rotation to grow a single crystal 13. At this time, the single crystal 13 is pulled so that a portion having an increasing diameter 13a, a portion having a constant diameter 13b, and a portion having a decreasing diameter 13c should be successively formed in this order.

Below the crucible, there is provided a subsidiary heater 9 based on resistance heating as subsidiary heating means for heating the crucible from below. Below the subsidiary heater 9, there is disposed a heat insulating material 11 to obtain insulation effectiveness. As for the configuration of the subsidiary heater 9, it may have a structure and size that enable heating of the crucible from below irrespective of the amount of the melt, and it may have a shape corresponding to the shape of the crucible, or a shape that have a portion much or less extending from the bottom side of the crucible to the lateral side of the crucible. As the subsidiary heating means, it is possible to use not only such a subsidiary heater based on resistance heating as described above, but also a heater based on high frequency heating, a lamp for radiation heating and so forth.

The heater 2 can be moved upwardly and downwardly by a lift mechanism (not shown) via heater supporting shafts 3 supporting the heater. Similarly, the subsidiary heater 9 can be moved upwardly and downwardly by a lift mechanism (not shown) via supporting shafts 10. A graphite crucible 5 is built in a crucible supporting disk 6 supporting the crucible, and the crucible supporting disk 6 is fixed at the top end of a crucible shaft 7. The crucible shaft 7 can be freely moved upwardly and downwardly and rotated by a driving mechanism (not shown).

These graphite crucible 5, heater 2 and subsidiary heater 9 are in a positional relationship that can be freely changed depending on, for example, the remaining amount of the raw material 12 in the crucible during the pulling of a single crystal and other conditions.

The subsidiary heater 9 may be connected to an electric power source (not shown) controlled independent of the heater 2, or connected so that they should be cooperatively controlled. Since the crystal quality is influenced by the temperature gradient of the single crystal, it is preferred that electric power values of the both heaters and/or a ratio of the both power values are preliminarily obtained by calculation based on global heat transfer analysis, the obtained value(s) is/are used as a target value or values of control, and electric powers supplied to the heaters are controlled to be as near the target value or values as possible, in order to maintain at least the temperature gradient along the pulling axis direction to be constant even if the single crystal formation ratio is changed. More specifically, it is preferred that, for example, in the calculation based on global heat transfer analysis, electric power is applied to the heater 2 so that the temperature gradient of the single crystal should become constant, and electric power to be applied to the subsidiary heater 9 is determined so that the heat balance of the whole system and the diameter of the single crystal can be arbitrarily controlled. In actual crystal pulling, priority can be given to the change of the electric power applied to the heater 2 with time series, and the electric power applied to the subsidiary heater 9 can be controlled as a controllable factor involved in the control of diameter of single crystal.

Hereafter, pulling of a semiconductor single crystal using the aforementioned single crystal pulling apparatus 1 and a case of multi pulling utilizing another addition of raw material will be explained.

When a single crystal is pulled by using the single crystal pulling apparatus 1, if the remaining amount of the raw material melt 12 is decreased, the area receiving heat from the heater 2 is decreased. On the other hand, heat is always taken away from the melt surface by heat radiation at a degree proportional to its area, i.e., square of the inner diameter of the crucible. Therefore, it becomes difficult to maintain the temperature of the melt only by the heater 2. This tendency becomes more significant as the diameter of the crucible becomes larger.

Figure 2:
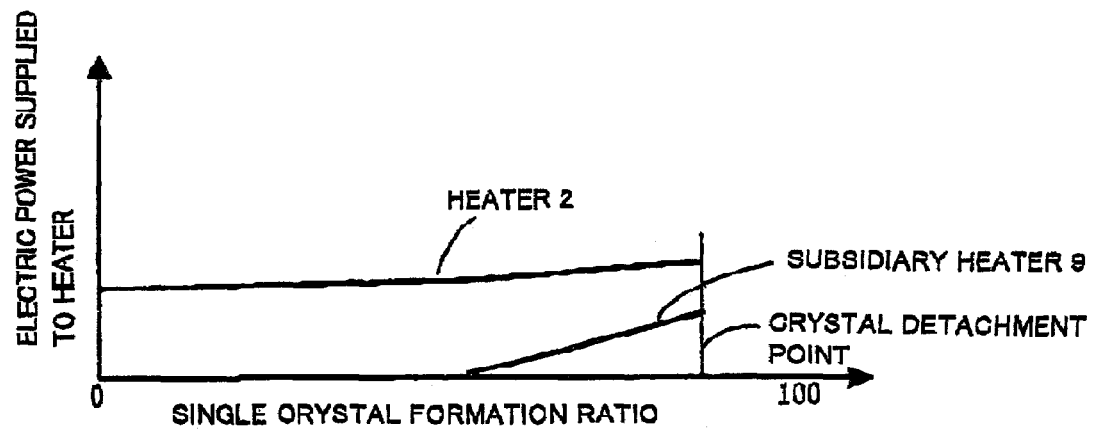
FIG. 2 is a diagram showing exemplary relationship between electric powers supplied to heaters and a single crystal formation ratio at the time of crystal pulling according to the present invention.
Figure 3:
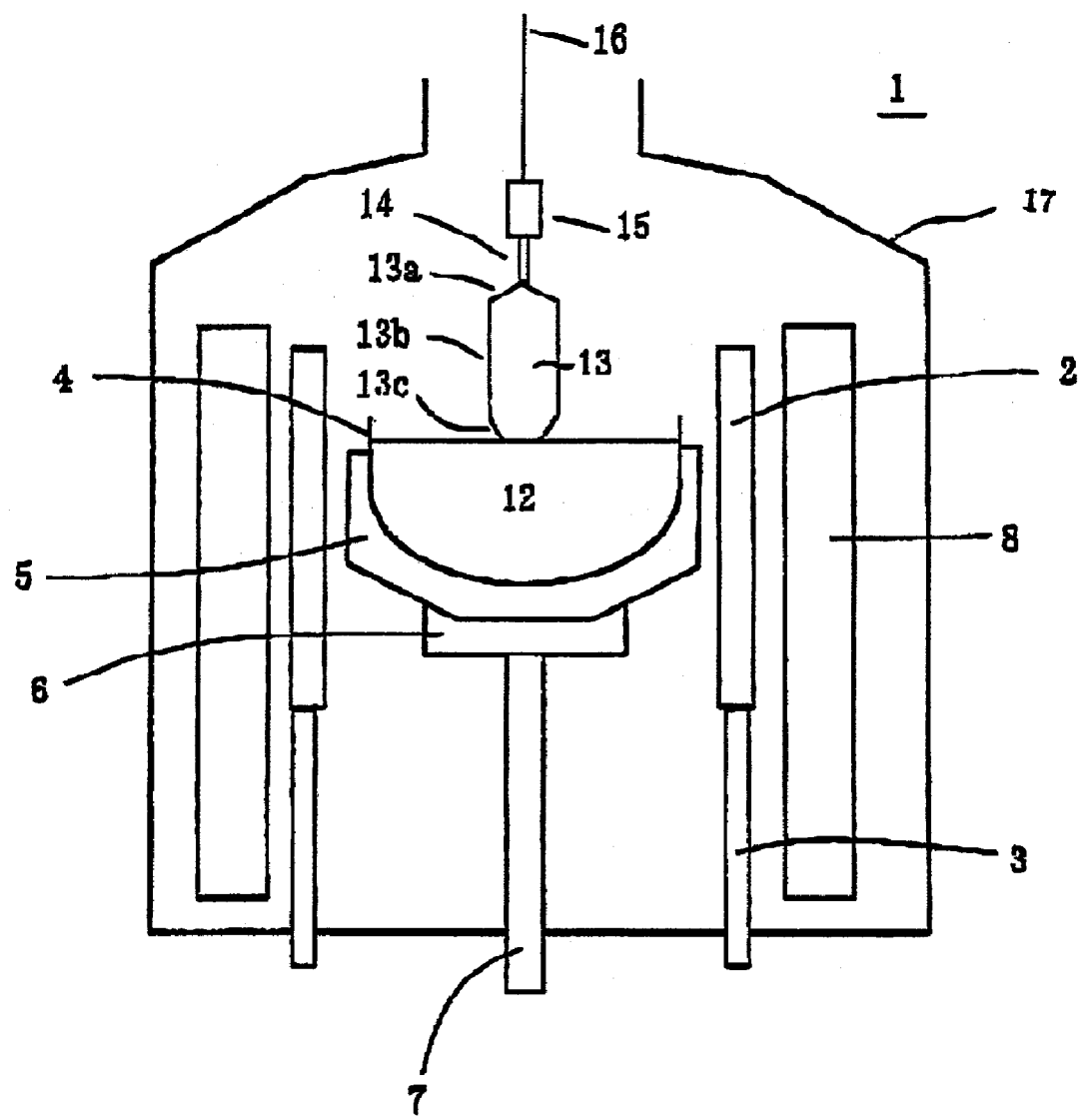
FIG. 3 is an explanatory view showing an exemplary conventional apparatus for pulling a crystal.
Figure 4:
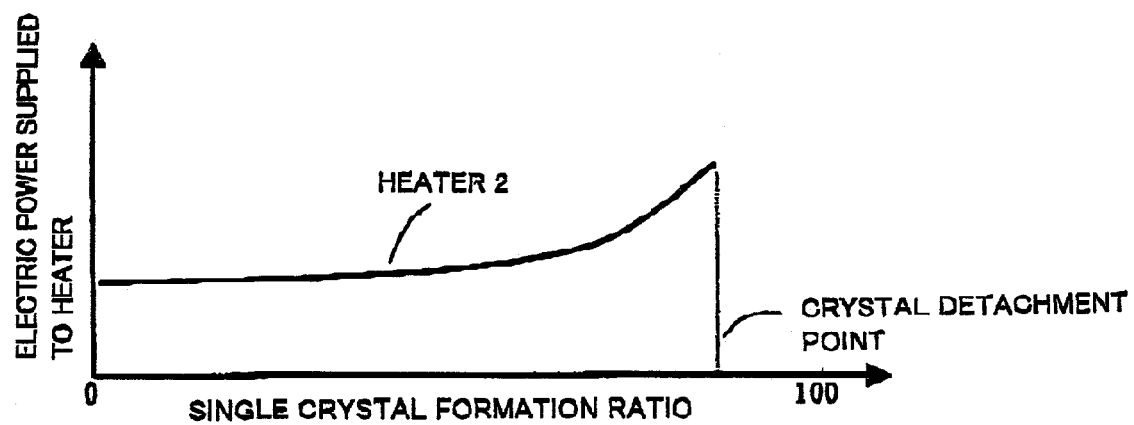
FIG. 4 is a diagram showing exemplary relationship between electric power supplied to a heater and a single crystal formation ratio at the time of conventional crystal pulling.

Therefore, subsidiary heating of the crucible is performed from below by the subsidiary heater 9 as the remaining amount of the melt decreases. This makes it possible to compensate the heat loss due to the reduction of the area for receiving heat from the heater 2 irrespective of the remaining amount of the melt, and the temperature of the melt can be maintained to be a suitable temperature without unduly increasing the electric power supplied to the heater 2. Since it is not required to markedly increase the electric power supplied to the heater 2, the temperature distribution of the single crystal under pulling is not substantially influenced. If rather rapid cooling is desired for the temperature distribution of the single crystal, the electric power supplied to the subsidiary heater 9 can be made rather higher, and the electric power supplied to the heater 2 can be made rather smaller. Conversely, if rather gradual cooling is desired for the temperature distribution of the single crystal, the electric power supplied to the subsidiary heater 9 can be made rather smaller, and the electric power supplied to the heater 2 can be made rather higher. Exemplary patterns of electric powers supplied to the heater 2 and the subsidiary heater 9 with respect to the single crystal formation ratio are shown in FIG. 2.

If the method of the present invention is used, the amount of the melt to be remained in the crucible can be made small, and therefore a single crystal can be obtained with a high yield.

In the multi-pulling, after a grown single crystal ingot is detached from the melt and taken out from the single crystal pulling apparatus 1, the raw material is newly added to the raw material melt remained in the crucible and another single crystal is pulled again. When the raw material is additionally introduced, what is important is to maintain the temperature so that the raw material melt should not completely solidify. This is because, if the raw material melt completely solidifies in the crucible, a stress is applied to the crucible by the volume change at the time of solidification, and the crucible may be cracked.

Therefore, the crucible is subsidiarily heated from below by the subsidiary heater 9 so that the melt should not completely solidify after the detachment of the single crystal ingot. This makes it possible to compensate the reduction of the area for receiving heat from the heater 2 irrespective of the remaining amount of the melt. Further, when the raw material is additionally introduced, the temperature of the melt is likely to decrease. Therefore, the electric power supplied to the subsidiary heater is increased according to the introduction of the raw material.

In this way, the temperature of the melt can be maintained to be a suitable temperature without unduly increasing the electric power supplied to the heater 2. As a result, deformation and degradation of the crucible can be prevented.

Furthermore, if the method of the present invention is used, the amount of the melt remaining in the crucible can be made small, and therefore a single crystal can be obtained with a high yield.

Hereafter, the present invention will be explained with reference to the following examples and comparative examples.

EXAMPLE 1

Silicon single crystals were pulled by using such a single crystal pulling apparatus 1 as shown in FIG. 1. The size of the quartz crucible 4 was 32 inches for the inner diameter. The amount of 300 kg of silicon raw material 12 was charged in the quartz crucible 4, and crystals having a diameter of 12 inches were pulled. In the range of the single crystal formation ratio of from 0 to 60%, the pulling was performed by using only the heater 2. In the range of the single crystal formation ratio of 60% or higher, subsidiary heating was performed by the subsidiary heater 9 in addition to the heating by the heater 2. The electric powers supplied to the heater 2 and the subsidiary heater 9 were controlled so that the pulling rate for a portion having a constant diameter of the single crystals should be maintained to be 0.8 mm/min. Specifically, at a single crystal formation ratio of 60% or higher, the electric power supplied to the heater 2 was maintained to be constant, and the control of heating concerning the control of the diameter is attained by the subsidiary heater 9. In this test, ten crystals were experimentally pulled.

COMPARATIVE EXAMPLE 1

For comparison, crystals having a diameter of 12 inches were also pulled with the same pulling apparatus 1, quartz crucible 4 and amount of the raw material 12 as those of Example 1, but only the heater 2 was used throughout the experiment. As for the pulling rate of single crystals, the electric power supplied to the heater 2 was controlled so that the pulling rate for a portion having a constant diameter of the single crystals should be maintained to be 0.8 mm/min. In this test, ten crystals were experimentally pulled.

The presence of solidification of the melt was investigated at single crystal formation ratios of 60%, 70%, 80% and 85%. The investigation results for Example 1 and Comparative Example 1 are shown in Table 1 as percentages of the numbers of crystals for which generation of solidification was observed relative to the number of experimentally pulled crystals.

TABLE 1

| Single crystal formation ratio (%) | Example 1 (%) | Comparative Example 1 (%) |
| --- | --- | --- |
| 60 | 0 | 0 |
| 70 | 0 | 20 |
| 80 | 0 | 50 |
| 85 | 0 | 100 |

As shown in Table 1, since heating by the subsidiary heater 9 was added for the period when the single crystal formation ratio was 60% or higher in the single crystal pulling method of Example 1 according to the present invention, single crystals could be stably pulled without causing solidification of the melt for all of the single crystal formation ratios of from 60% to 85%.

On the other hand, in the conventional single crystal pulling method of the comparative example, solidification was occasionally observed at the melt surface at a single crystal formation ratio of 70%. Furthermore, at a single crystal formation ratio of 85%, solidification was generated and the solid matter adhered to the growing interface of the single crystals in all of the pulling tests. Therefore, it became impossible to continue the pulling of the crystals. In Comparative Example 1, since the subsidiary heater 9 was not used, solidification occurred at a single crystal formation ratio of 70%. However, in Example 1, since the heating by the subsidiary heater 9 was performed at a single crystal formation ratio of 60% or higher, solidification was not caused. From these results, it can be said that the subsidiary heating by the subsidiary heater 9 was effective for the period after the single crystal formation ratio reached and exceeded 60%.

EXAMPLE 2

Crystals having a diameter of 12 inches were pulled with the same pulling apparatus 1, quartz crucible 4 and amount of the raw material 12 as those of Example 1, so that the pulling rate for a portion having a constant diameter of the single crystals should be maintained to be 0.8 mm/min. Prior to the pulling, there were determined, by calculation based on global heat transfer analysis, such electric powers supplied to the heater 2 and the subsidiary heater 9 that the temperature distribution in the single crystals along the pulling axis direction should not be changed even if the single crystal formation ratio increased to be 60%, 70%, 80% and 85%. When single crystals were pulled, the electric powers supplied to the heaters were controlled so as to approach the calculated electric power values. In this Example, the electric powers supplied to the heater 2 and the subsidiary heater 9 were 150 kW and 20±5 kW, 145 kW and 25±7 kW, 140 kW and 28±8 kW, for the ranges of single crystal formation ratio of 60 to 69%, 70 to 79% and 80 to 85%, respectively. The reason why electric power supplied to the subsidiary heater 9 was indicated with a certain allowance is that it was changed for controlling the diameter of single crystals.

In order to investigate the crystal defect density of the pulled single crystals, FPDs (Flow Pattern Defects) were measured. As for FPD, when a wafer sliced from a grown silicon single crystal ingot is subjected to etching with a mixture of hydrofluoric acid and nitric acid to remove a surface damaged layer, and surface etching with a mixture of $K_2Cr_2O_7$, hydrofluoric acid and water (Secco etching), pits and flow patterns are formed on the wafer surface. The flow pattern is called FPD, and it is considered that it consists of voids formed by aggregation of vacancies.

As a result of investigation of FPD density distribution of the pulled crystals along the pulling axis direction, it was demonstrated that the FPD density fell within a range of 300 to $320/cm^2$ at any point along the pulling axis direction, and thus the method of determining the electric powers supplied to the heaters by calculation baaed on global heat transfer analysis effectively worked.

If the calculation based on global heat transfer analysis is not used, single crystal pulling tests must be performed for a large number of combinations of electric powers supplied to the heater 2 and the subsidiary heater 9 to investigate the crystal defect distribution. Therefore, enormous cost and time are spent for the determination of the single crystal pulling conditions.

However, if the electric powers supplied to the heaters providing uniform defect distribution are preliminarily determined by the calculation based on global heat transfer analysis as in the present invention, the number of pulling tests can be markedly reduced. If the electric power supplied to the heaters are desired to be controlled, the calculation based on global heat transfer analysis can be performed again to reflect a desired degree of gradual cooling of single crystal or desired degree of rapid cooling of single crystal.

EXAMPLE 3

Crystals having a diameter of 12 inches were pulled with the same pulling apparatus 1, quartz crucible 4 and amount of the raw material 12 as those of Example 1. Subsidiary heating was performed by the subsidiary heater 9 for a period when the single crystal formation ratio was 60% or higher, and a single crystal ingot was detached from the melt at a single crystal formation ratio of 70%. Then, while the electric power supplied to the heater 2 at the point of the detachment of the single crystal was maintained and subsidiary heating was performed by the subsidiary heater 9 so that the melt should not solidify, additional 110 kg of the raw material was newly introduced into the remaining melt, and a second single crystal was pulled at a single crystal formation ratio of 70%.

COMPARATIVE EXAMPLE 2

For comparison, pulling was also performed with the same pulling apparatus 1, quartz crucible 4, raw material 12, single crystal formation ratio and amount of the additional raw material as those of Example 3, by using only the heater 2 throughout the experiment. After the first single crystal was detached, the electric power supplied to the heater 2 was increased so that the melt in the crucible should not solidify.

While the quartz crucible was not deformed in Example 3, the upper portion of the quartz crucible body was deformed inwardly in Comparative Example 2. This shows that the deformation of the crucible can be prevented by subsidiarily heating the crucible from below.

The present invention is not limited to the embodiments described above. The above-described embodiments are mere examples, and those having the substantially same structure as that described in the appended claims and providing the similar functions and advantages are included in the scope of the present invention.

For example, the Czochralski method referred to in the present invention also includes the MCZ method (magnetic field-applied Czochralski method), in which a single crystal is grown with applying a magnetic field to a melt in a crucible. The MCZ method includes the cusp magnetic field field-applied method, horizontal magnetic field-applied method, and vertical magnetic field-applied method. The method for pulling a single crystal according to the present invention can of course be used also in the MCZ method, and exert the effect.

The invention claimed is:

1. A method for growing a semiconductor single crystal according to the Czochralski method utilizing an apparatus for producing a semiconductor single crystal having a crucible to be charged with a raw material, a heater surrounding the crucible, pulling means for bringing a seed crystal into contact with a melt contained in the crucible and growing a single crystal and a metal chamber for accommodating the foregoing members, wherein a crucible having an inner diameter of 28 inches or more is used and the apparatus is provided with subsidiary heating means below the crucible, and the single crystal is pulled with subsidiarily heating the crucible by the subsidiary heating means in addition to the heating by the heater surrounding the crucible for a period after a ratio of a weight of the growing crystal during the pulling of the crystal relative to a weight of raw material melt before the growing becomes 60% or more, and after a the grown single crystal is detached from the melt and taken out from the apparatus for producing a crystal, a raw material is newly added to the raw material remained in the crucible and melted, and when a seed crystal is brought into contact with the melt to pull a single crystal again, the crucible is heated by the heater surrounding the crucible and the subsidiary heating means to prevent solidification of raw material melt at least for a period from the point of the detachment of the single crystal ingot to the point of complete melting of the raw material in the crucible including the raw material newly added thereto and the electric power supplied to the subsidiary heating means is increased when the raw material is newly added to the raw material melt remaining in the crucible.

2. The method for growing a semiconductor single crystal according to claim 1, wherein the heating by the subsidiary heating means is performed so that temperature gradient of the single crystal surface along the pulling axis direction is constant.

3. The method for growing a semiconductor single crystal according to claim 1, wherein electric power values of the heater surrounding the crucible and the subsidiary heating means and/or a ratio of the both power values are obtained by calculation based on global heat transfer analysis, the obtained value(s), is/are used as a target value or values of control, and electric powers supplied to the heater and the subsidiary heating means are controlled to approach the target value or values during the pulling of the single crystal.

4. The method for growing a semiconductor single crystal according to claim 2, wherein electric power values of the heater surrounding the crucible and the subsidiary heating means and/or a ratio of the both power values are obtained by calculation based on global heat transfer analysis, the obtained value(s) is/are used as a target value or values of control, and electric powers supplied to the heater and the subsidiary heating means are controlled to approach the target value or values during the pulling of the single crystal.

* * * * *